United States Patent
Bauernschmitt et al.

(10) Patent No.: US 6,954,621 B2
(45) Date of Patent: Oct. 11, 2005

(54) METHOD OF AND APPARATUS FOR PREDISTORTING A TRANSMIT SIGNAL

(75) Inventors: Rüdiger Bauernschmitt, Linkenheim-Hochstetten (DE); Gerd Wölfle, Gärtringen (DE)

(73) Assignee: Alcatel, Paris (FR)

( * ) Notice: Subject to any disclaimer, the term of this patent is extended or adjusted under 35 U.S.C. 154(b) by 407 days.

(21) Appl. No.: 10/166,075

(22) Filed: Jun. 11, 2002

(65) Prior Publication Data

US 2002/0193086 A1 Dec. 19, 2002

(30) Foreign Application Priority Data

Jun. 14, 2001 (EP) .................................. 1440167

(51) Int. Cl.$^7$ .................. H01Q 11/12; H04B 1/10; H04B 17/00; H03C 1/62
(52) U.S. Cl. ................. 455/126; 455/114.3; 455/114.1; 455/115.1; 455/108; 455/295; 455/303; 455/127.2
(58) Field of Search ................ 455/126–127.2, 455/114.1–114.3, 108–111, 124, 125, 115.1, 115.3, 119, 295, 296, 303; 332/100, 103, 144, 149; 375/224, 279, 280, 281, 283, 308, 296

(56) References Cited

U.S. PATENT DOCUMENTS 4,882,547 A    11/1989  Katz
5,371,481 A  * 12/1994  Tiittanen et al. ............ 332/103
5,524,285 A    6/1996   Wray et al.
5,542,096 A  * 7/1996   Cygan et al. ............. 455/115.2
5,892,397 A    4/1999   Belcher et al.
6,246,865 B1 * 6/2001   Lee .......................... 455/114.3
6,275,103 B1 * 8/2001   Maniwa ....................... 330/149
6,384,677 B2 * 5/2002   Yamamoto ................... 330/10

FOREIGN PATENT DOCUMENTS

GB      2283629 A   *  5/1995   .............. H03F/1/32
WO   WO 00/72438 A1    11/2000

* cited by examiner

Primary Examiner—Duc M. Nguyen
(74) Attorney, Agent, or Firm—Sughrue Mion, PLLC

(57) ABSTRACT

An improved method of predistorting a transmit signal is disclosed whereby the distortions occurring in all nonlinear subassemblies are compensated for using a particularly suited feedback signal. Also disclosed are a transmitter, a transmitting station, and a communications system using the method. The transmit signal, before being converted to the desired radio frequency, is digitally predistorted at baseband by digital signal processing means which are controlled by the feedback signal. This signal is generated by a detector measuring the spectral power of the transmit signal at the desired radio frequency both within a first frequency range, which lies within the transmission spectrum, and within a second frequency range, which lies outside the transmission spectrum. The digital predistortion disclosed is flexibly parameterized and is adapted by the feedback control to the current behavior of the transmitter subassemblies.

5 Claims, 4 Drawing Sheets

METHOD OF AND APPARATUS FOR PREDISTORTING A TRANSMIT SIGNAL

BACKGROUND OF THE INVENTION

The invention is based on a priority application EP 01 440 167.3 which is hereby incorporated by reference. This invention is related to a method of predistorting a transmit signal in a transmitter comprising a power amplifier, said method comprising the steps of: predistorting the transmit signal, and amplifying the transmit signal at the desired radio frequency by means of the power amplifier and transmitting it, wherein the transmit signal is digitally predistorted at baseband and then up-converted to the desired radio frequency, the digital predistortion of the transmit signal being controlled by a feedback signal which is generated by a detector measuring the spectral power of the transmit signal at the desired radio frequency both within a first frequency range, which lies in the transmission spectrum, and within a second frequency range, which lies outside the transmission spectrum.

Furthermore, the invention relates to apparatus for carrying out the method, namely to a transmitter, a transmitting station equipped therewith, and a communications system equipped therewith, as set forth in the preambles of the respective independent claims.

SUMMARY OF THE INVENTION

During the generation of a transmit signal in a transmitter, particularly during modulation with a nonconstant envelope, and during the power amplification of the transmit signal, the nonlinear performance of the subassemblies causes distortions which degrade the quality of the signal. To meet this problem, linearizing techniques are commonly employed.

U.S. Pat. No. 5,892,397 discloses a radio transmitter incorporating a power amplifier and a preceding predistortion unit which predistorts the transmit signal in accordance with variable weighting coefficients. The coefficients are optimized as a function of the spectral power measured at the output of the power amplifier using a suitable method (see column 2, lines 7–19). The measurements are made in a frequency range outside the transmission band proper, so that the spectral power measured there is representative of an error value (see column 6, lines 57–66). The predistortion itself is introduced at the input of the power amplifier, i.e., at the desired radio frequency (see column 3, lines 23–34). This prior-art method and the transmitter for carrying out the same do not completely solve the problem of signal distortion since the predistortion directly at the input of the power amplifier does not act on the preceding subassemblies, such as the power divider or the modulation stage.

It is an object of the invention to provide an improved method of predistorting a transmit signal whereby the distortions occurring in all subassemblies are compensated for using a particularly suited feedback signal. In addition, a transmitter, a transmitting station, and a communications system using the method are to be provided.

The object is attained by a method of predistorting transmit signals in a transmitter comprising a power amplifier, said method comprising the steps of: predistorting the transmit signal, and amplifying the transmit signal at the desired radio frequency by means of the power amplifier and transmitting it, wherein the transmit signal is digitally predistorted at baseband and then up-converted to the desired radio frequency, the digital predistortion of the transmit signal being controlled by a feedback signal which is generated by a detector measuring the spectral power of the transmit signal at the desired radio frequency both within a first frequency range, which lies in the transmission spectrum, and within a second frequency range, which lies outside the transmission spectrum and by a transmitter, a transmitting station, and a communications system with the features of the respective independent claims.

Accordingly, the transmit signal, before being converted to the desired video frequency, is digitally predistorted at baseband by digital signal processing means. The predistortion is controlled by a feedback signal which is generated by a detector measuring the spectral power of the transmit signal at the desired radio frequency both within a first frequency range, which lies in the transmission spectrum, and within a second frequency range, which lies outside the transmission spectrum. The digital predistortion is flexibly parameterized and is adapted by the feedback control to the current behavior of the transmitter subassemblies. As the detector measures both in the transmission band and, preferably at the same time, outside this transmission band, the instantaneous power of the transmitter's intermodulation products in adjacent channels can be measured as a control parameter. This control parameter is particularly suited for optimizing the predistortion of the transmit signal.

Particularly advantageous developments of the invention are apparent from the subclaims.

BRIEF DESCRIPTION OF THE DRAWINGS

The invention and the advantages resulting therefrom will become more apparent from the following description of an embodiment when taken in conjunction with the accompanying schematic drawings, in which:

FIG. 1 shows the flowchart for a method 100 by which a transmit signal is predistorted in a transmitter. The method comprises steps 110 to 132 and is carried out as follows.

Figure 1:
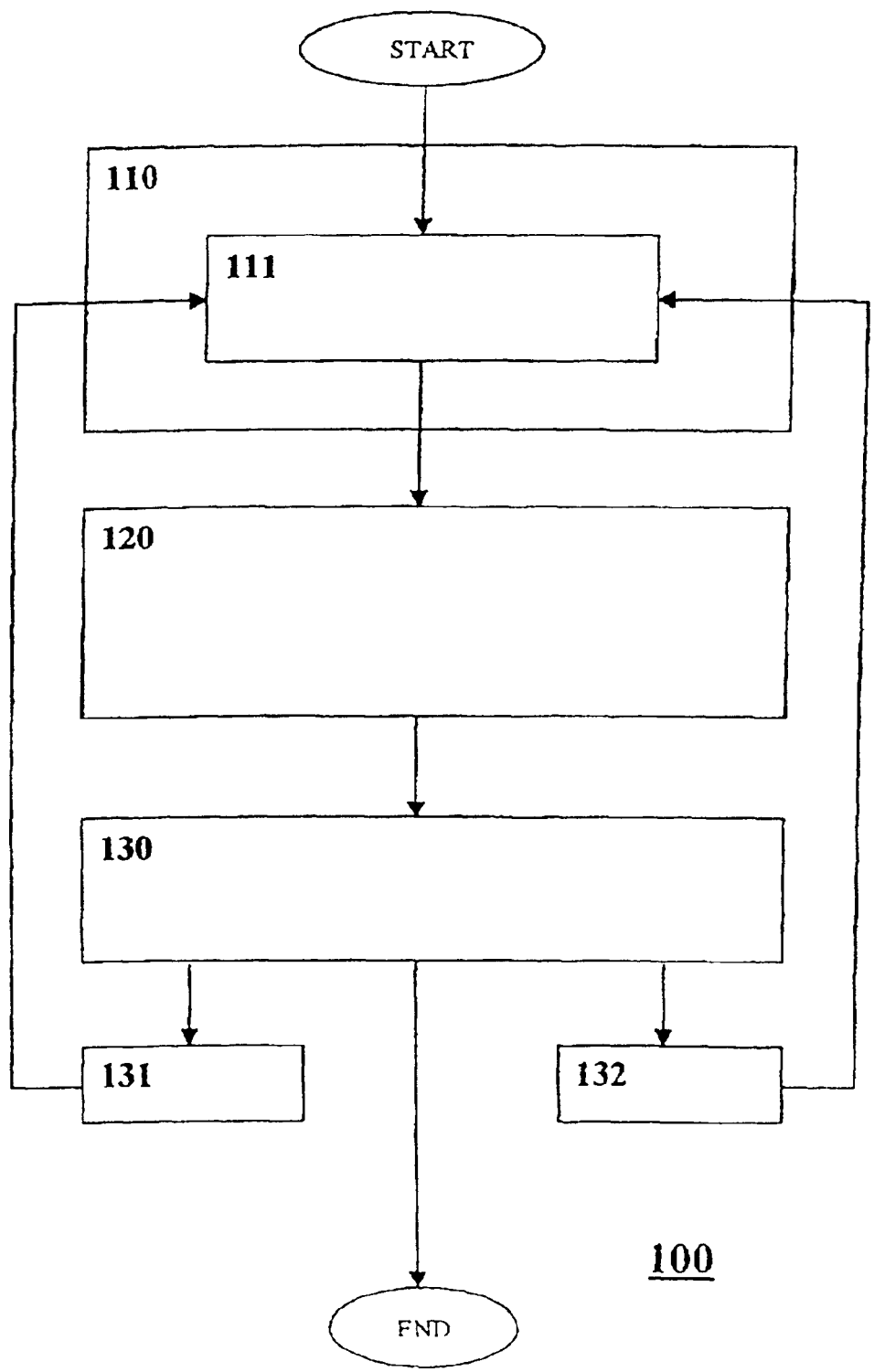
FIG. 1 shows the flowchart for a method according to the invention.

After the start of the procedure, at a first step 110, the transmit signal is predistorted. The predistortion occurs at baseband and is performed digitally, taking into account control parameters which are described below (step 111). After being predistorted, the transmit signal is up-converted from the baseband to the desired radio frequency. This takes place at the next step 120, which is performed by a mixer stage. At step 130, the up-converted signal is amplified. This is done in a power amplifier, which feeds the amplified signal to an antenna for transmission. Of the transmitted signal, two measurement samples are taken as follows:

At a first partial step 131, the spectral power of the transmitted signal is detected within a first bandpass-limited frequency range, which lies in the transmission band. At another, preferably simultaneously performed partial step 132, the spectral power is detected within a second bandpass-limited frequency range, which lies outside the transmission band. Thus, two measured values are obtained at the output of the power amplifier, one being representative of the power density within the transmission band and the other being representative of the power density outside the transmission band. These measured values are fed back to the predistortion performed in step 111 and serve as control parameters to optimize the predistortion. The difference between the power measured within the transmission band and the power measured outside the transmission spectrum is a quantity which is called the ACP (adjacent channel leakage power) for short. The ACP value represents a power of the intermodulation products resulting from nonlinearities of the transmitter, i.e., it is the power that is radiated as a result of intermodulation products in the adjacent channels. Using the ACP value thus determined, the digital predistortion can be optimized so as to minimize the loss at the output of the transmitter.

The measured values determined at steps 131 and 132 are preferably derived by down-converting the transmit signal from the desired radio frequency to an intermediate frequency. By varying the frequency of the local oscillator at the mixer, the spectral power of the transmit signal can be measured over the entire spectrum. It is also possible to scan the entire spectrum. This approach is particularly suited for broadband transmitters, particularly for multicarrier transmitters, since the bandwidth of the bandpass-limited signal used for the measurement does not increase proportionally to the bandwidth of the transmit signal proper.

The method described, 100, can be used in any transmitter incorporating nonlinear subassemblies, particularly power amplifiers. In the embodiment described herein, however, reference is preferably made to the use in radio transmitters, particularly in mobile-radio transmitters, which transmit radio signals with a particularly wide dynamic range over a broadband spectrum. Examples are the transmitters for the future mobile-radio system UMTS, where broadband spread-spectrum radio signals are generated.

Figure 2A:
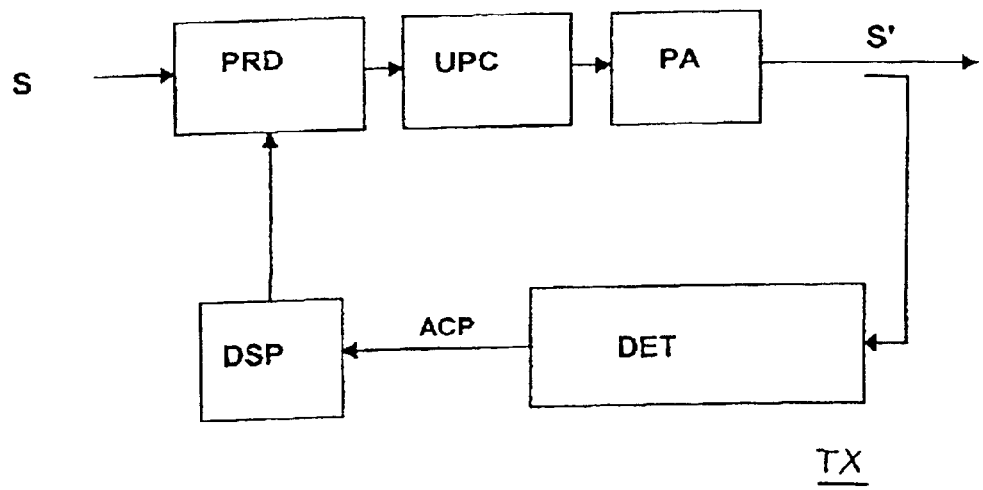
FIGS. 2a and 2b are block diagrams of a radio transmitter using this method.
Figure 2B:
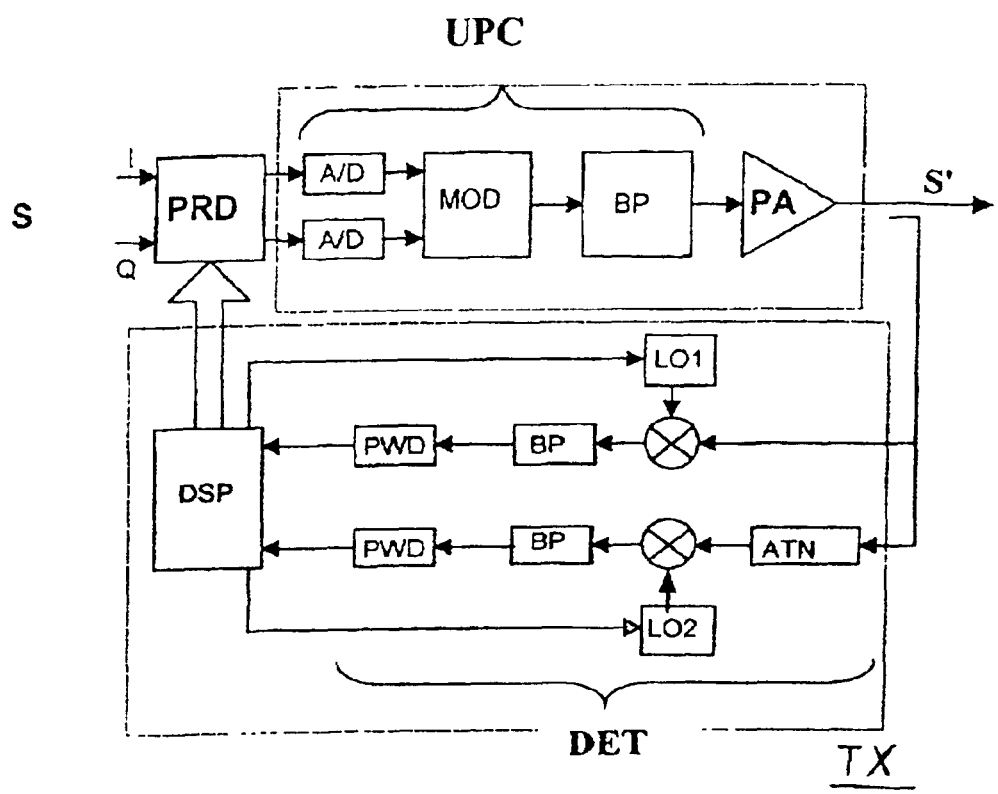
Figure 3:
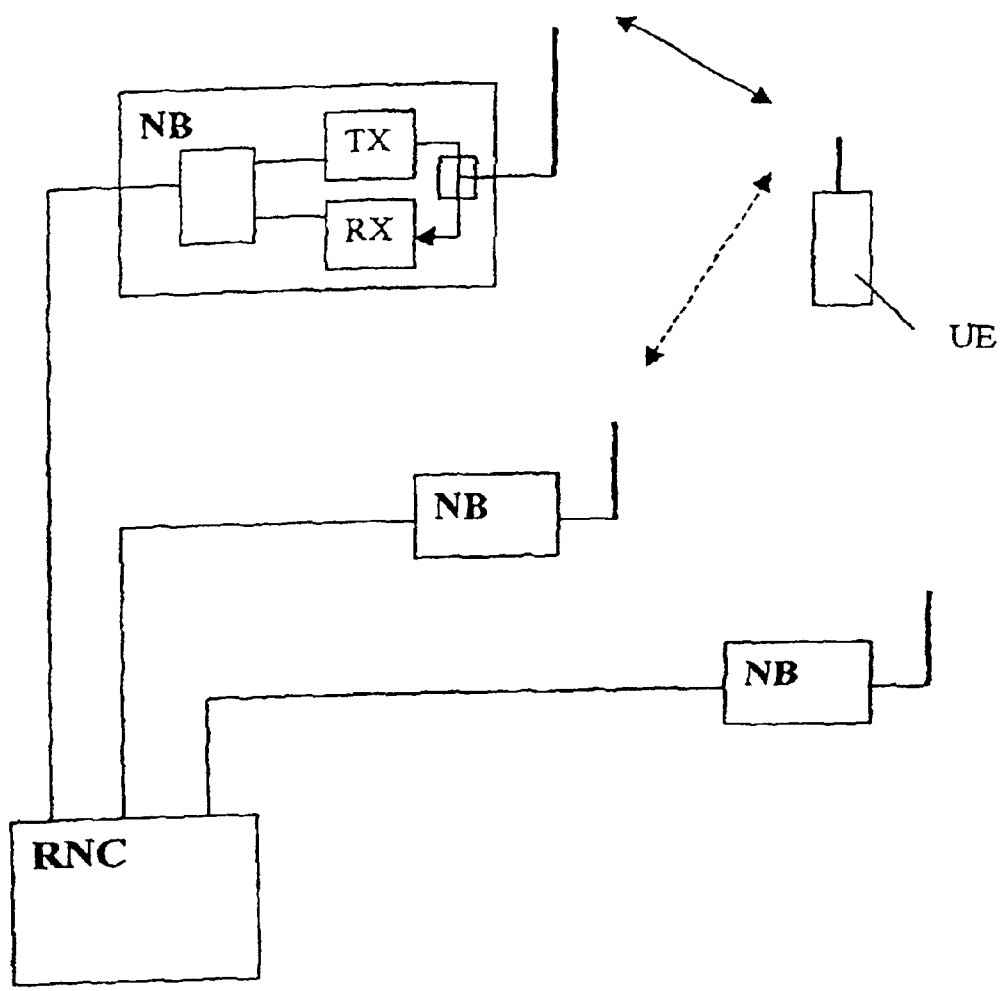
FIG. 3 is a block diagram of a wireless communications system equipped with such radio transmitters.

FIGS. 2a and 2b are block diagrams of a transmitter TX according to the invention, with FIG. 2a showing the general block diagram of the transmitter and FIG. 2b showing the more detailed construction.

The transmitter TX shown in FIG. 2a has a predistortion stage PRD, a subsequent mixer stage UPC, and a subsequent power amplifier PA. The transmit signal S applied at the input of predistortion stage PRD is predistorted at baseband, then up-converted to the desired radio frequency, and subsequently transmitted as a power-amplified transmit signal S' via an antenna (not shown). Transmitter TX further includes a detector DET, whose input is connected via a directional coupler to the output of the power amplifier, and a digital signal processor DSP following the detector and having its output coupled to the control input of predistortion stage PRD. Detector DET and signal processor DSP are the essential elements of a feedback loop which serves to control the predistortion in the stage PRD. The detector performs measurements on the transmit signal S' and forms a feedback signal ACP which specifies the power of the intermodulation products present in the transmitter, i.e., the loss in the transmission spectrum of the signal S'.

The more detailed construction of the transmitter is shown in FIG. 2b. As can be seen, the transmit signal S is transferred at baseband, in the form of its in-phase and quadrature components I and Q, to predistortion stage PRD. The digital output signals of predistortion stage PRD are then converted to analog signals and modulated in an IQ modulator MOD onto the radio-frequency carrier. A subsequent bandpass filter BP limits the radio-frequency signal before it is fed into power amplifier PA. The amplified transmit signal S' is then fed into the transmitting antenna.

The subassemblies preceding the power amplifier PA, particularly the modulator MOD, form parts of mixer stage UPC. The feedback channel, comprising detector DET and digital signal processor DSP, is constructed as follows.

The detector DET contains essentially two signal paths, one for measurements within the transmission band and one for measurements outside the transmission band. Starting from the directional coupler at the output of power amplifier PA, the first feedback signal path goes to a first mixer, which incorporates a first local oscillator LO1. The second, parallel signal path goes first to an attenuator ATN and then to a second mixer, which performs down-conversion with a second local oscillator LO2. The outputs of the mixers are connected to respective bandpass filters which limit the output signal to a narrow frequency range. The two local oscillators LO1 and LO2 are tuned such that this frequency range corresponds in the first path to a spectral range outside the transmission spectrum proper and in the second path to a spectral range within the transmission spectrum proper. The bandpass-limited signals are then supplied to power-measuring stages PWD which measure the spectral power of the transmit signal S' outside the transmission band (first signal path with LO1) and within the transmission band (second signal path with LO2). The measured values are fed to the digital signal processor DSP, which, in turn, controls the predistortion stage PRD via a control bus. The signal processor DSP thus transfers the parameters selected and optimized by it to the predistortion stage PRD.

The block diagrams of FIGS. 2a and 2b show only one possible realization of a transmitter according to the invention. For example, the predistortion function (PRD function) and the control function (DSP function) could be implemented in one unit, preferably in an FPGA or ASIC. It is also conceivable to use instead of two parallel signal paths only one signal path with a mixer which down-converts the transmit signal alternately with the first and second local-oscillator frequencies. It is advantageous, however, if the transmit signal is measured within the transmission band and outside the transmission band simultaneously with both intermediate frequencies. This makes it possible to exactly calculate the instantaneous intermodulation power of the transmitter referred to the output power. Through the measurements made at the intermediate frequency, it is possible to examine each subrange of the spectrum by suitably adjusting the oscillators LO1 and LO2. In this way, the controlled predistortion can be rapidly adapted to the respective requirements, particularly to transmission methods and carrier-frequency schemes. The invention is particularly suited for power control in transmitters with a wide dynamic range, particularly in radio transmitters and optoelectronic transmitters.

What is claimed is:

1. A method of predistorting transmit signals in a transmitter comprising a power amplifier, said method comprising the steps of:

predistorting the transmit signal, and amplifying the transmit signal at the desired radio frequency by means of the power amplifier and transmitting it, wherein the transmit signal is digitally predistorted at baseband and then up-converted to the desired radio frequency, the digital predistortion of the transmit signal being controlled by a feedback signal which is generated by a detector measuring the spectral power of the transmit signal at the desired radio frequency both within a first frequency range, which lies in the transmission spectrum, and within a second frequency range, which lies outside the transmission spectrum; and wherein the first and second frequency ranges are limited by means of respective bandpass filters, and that the spectral power is measured in these frequency ranges by down-converting the transmit signal from the desired radio frequency to an intermediate frequency, with the frequency of a local oscillator in a mixer being variable, so that it is possible to measure in the entire transmit-signal band.

2. A method as set forth in claim 1, wherein the spectral power of the transmit signal is measured within the first frequency range and at the same time within the second frequency range.

3. A transmitter for transmitting a transmit signal, comprising:

a predistortion stage for predistorting the transmit signal, and a subsequent power amplifier for amplifying the transmit signal at the desired radio frequency for transmission, wherein said transmitter further comprises:

a mixer stage following the predistortion stage and preceding the power amplifier for up-converting the predistorted transmit signal at the desired radio frequency, that the predistortion stage comprises signal processing means for digitally predistorting the transmit signal, and that the power amplifier has its output connected to a detector which generates a feedback signal for controlling the signal processing means of the predistortion stage by measuring the spectral power of the transmit signal at the desired radio frequency both within a first frequency range, which lies in the transmission spectrum, and within a second frequency range, which lies outside the transmission spectrum, and wherein the first and second frequency ranges are limited by respective bandpass filters, and the spectral power is measured in these frequency ranges by down-converting the transmit signal from the desired radio frequency to an intermediate frequency, with the frequency of a local oscillator in a mixer being variable, so that it is possible to measure in the entire transmit-signal band.

4. A transmitting station comprising a transmitter for transmitting a transmit signal, said transmitter comprising a predistortion stage for predistorting the transmit signal and a subsequent power amplifier for amplifying the transmit signal for transmission, said transmitter further comprises a mixer stage following the predistortion stage and preceding the power amplifier for up-converting the predistorted transmit signal at the desired radio frequency, that the predistortion stage comprises signal processing means for digitally predistorting the transmit signal, and that the power amplifier has its output connected to a detector which generates a feedback signal for controlling the signal processing means of the predistortion stage by measuring the spectral power of the transmit signal at the desired radio frequency both within a first frequency range, which lies in the transmission spectrum, and within a second frequency range, which lies outside the transmission spectrum, and wherein the first and second frequency ranges are limited by means of respective bandpass filters, and that the spectral power is measured in these frequency ranges by down-converting the transmit signal from the desired radio frequency to an intermediate frequency, with the frequency of a local oscillator in a mixer being variable, so that it is possible to measure in the entire transmit-signal band.

5. A communications system comprising at least one transmitting station with a transmitter for transmitting a transmit signal, said transmitter comprising a predistortion stage for predistorting the transmit signal, a subsequent mixer stage for up-converting the predistorted transmit signal at the desired radio frequency, and a subsequent power amplifier for amplifying the up-converted transmit signal for transmission, said transmitter further comprises a mixer stage following the predistortion stage and preceding the power amplifier for up-converting the predistorted transmit signal at the desired radio frequency, that the predistortion stage comprises signal processing means for digitally predistorting the transmit signal, and that the power amplifier has its output connected to a detector which generates a feedback signal for controlling the signal processing means of the predistortion stage by measuring the spectral power of the transmit signal at the desired radio frequency both within a first frequency range, which lies in the transmission spectrum, and within a second frequency range, which lies outside the transmission spectrum, and wherein the first and second frequency ranges are limited by means of respective bandpass filters, and that the spectral power is measured in these frequency ranges by down-converting the transmit signal from the desired radio frequency to an intermediate frequency, with the frequency of a local oscillator in a mixer being variable, so that it is possible to measure in the entire transmit-signal band.

* * * * *